US009024666B2

(12) United States Patent
Jovenin et al.

(10) Patent No.: US 9,024,666 B2
(45) Date of Patent: May 5, 2015

(54) PHASE-LOCKED LOOP DEVICE WITH SYNCHRONIZATION MEANS

(71) Applicant: Asahi Kasei Microdevices Corporation, Tokyo (JP)

(72) Inventors: Fabrice Jovenin, Colombelles (FR); Cedric Morand, Colombelles (FR)

(*) Notice: Subject to any disclaimer, the term of this patent is extended or adjusted under 35 U.S.C. 154(b) by 0 days.

(21) Appl. No.: 14/296,632

(22) Filed: Jun. 5, 2014

(65) Prior Publication Data

US 2014/0361817 A1      Dec. 11, 2014

(30) Foreign Application Priority Data

Jun. 10, 2013   (EP) .................................... 13305777

(51) Int. Cl.
*H03L 7/08* (2006.01)
*H03L 7/10* (2006.01)
*H03L 7/199* (2006.01)

(52) U.S. Cl.
CPC .. *H03L 7/08* (2013.01); *H03L 7/10* (2013.01); *H03L 7/199* (2013.01)

(58) Field of Classification Search
USPC ................................................ 327/147–161
See application file for complete search history.

(56) References Cited

U.S. PATENT DOCUMENTS

| 4,597,019 | A | * | 6/1986 | Nishimoto et al. ............ 386/308 |
| 5,304,951 | A | * | 4/1994 | Cosand ......................... 331/1 A |
| 6,456,132 | B1 | | 9/2002 | Kouzuma |
| 2010/0315138 | A1 | * | 12/2010 | Namba et al. ................. 327/157 |

FOREIGN PATENT DOCUMENTS

| DE | 3822293 A1 | 1/1990 |
| EP | 0553748 A2 | 8/1993 |

OTHER PUBLICATIONS

Extended European Search Report issued in corresponding European Patent Application No. 13305777.8 dated Oct. 18, 2013.

* cited by examiner

*Primary Examiner* — John Poos
*Assistant Examiner* — David Mattison
(74) *Attorney, Agent, or Firm* — Morgan, Lewis & Bockius LLP

(57) ABSTRACT

A phase-locked loop (PLL) device includes synchronization means suitable for synchronizing a frequency-converted signal produced by a frequency divider of the PLL device, with a reference signal supplied to the PLL device. A time duration of a frequency/phase lock acquisition step which is performed upon starting an operation of the PLL device can be reduced. In addition, when operating several PLL devices simultaneously, the synchronization units allow recovering target values for phase differences that exist between the respective frequency-converted signals of the PLL devices. To this end, synchronization is requested at a same time for all the PLL devices after they are all running in locked state.

8 Claims, 6 Drawing Sheets

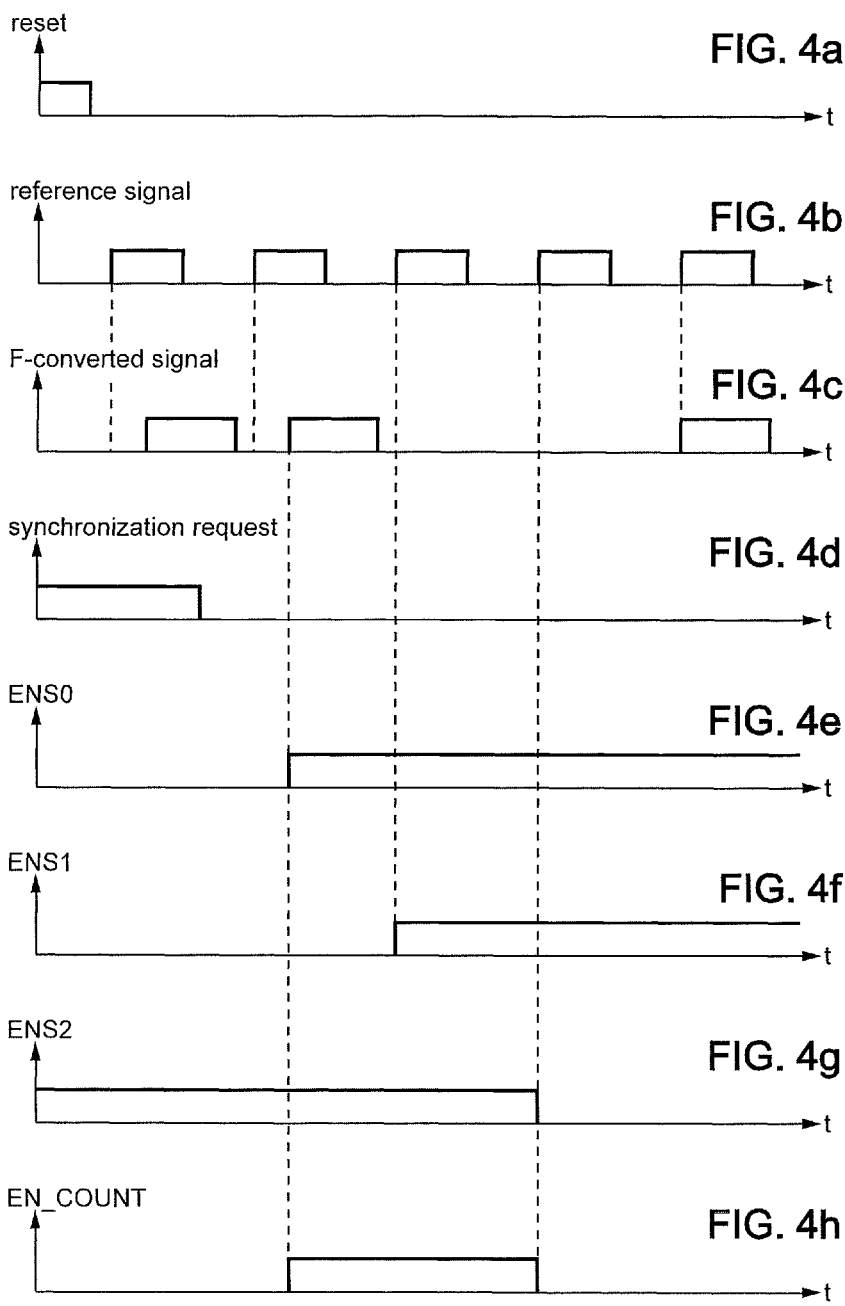

PHASE-LOCKED LOOP DEVICE WITH SYNCHRONIZATION MEANS

This application claims the priority and benefit of European patent no. 13305777.8 to Asahi Kasei Microdevices Corporation of Japan, entitled "Phase-Locked Loop Device With synchronization Means," filed Jun. 10, 2013, which is hereby incorporated by reference in its entirety.

TECHNICAL FIELD

The invention relates generally to a phase-locked loop (PLL) device that is provided with synchronization capabilities. The invention also relates to processes for operating such a PLL device, and operating simultaneously several such PLL devices.

BACKGROUND OF THE INVENTION

Numerous electric or integrated electronic circuits include PLL devices as frequency synthesizers. FIG. 1 is a block diagram of such a PLL device that comprises the following:
- a phase comparator 1, denoted PHASE_COMP and possibly comprising a charge pump, and having a first comparator input 1a intended for receiving a reference signal comprised of a reference cycle that is repeated at a reference frequency denoted $F_{REF}$, a second comparator input 1b for receiving a frequency-converted signal, and a comparator output 1c that is adapted for producing an error signal representative of a phase time-shift existing between the reference signal and the frequency-converted signal;
- a loop filter 2, having a filter input 2a that is connected to the comparator output 1c, and suitable for producing a control voltage based on a time-filtering of the error signal at a filter output 2b;
- a voltage-controlled oscillator (VCO) module 3, having a control input 3a connected to the filter output 2b, and a VCO output 3c for producing a VCO signal that has a VCO frequency denoted $F_{VCO}$ and varying as a function of the control voltage; and
- a frequency divider 4, which is denoted F_DIVIDER, and is connected at a divider input 4a to the VCO output 3c, and adapted for producing at a divider output 4c the frequency-converted signal based on the VCO signal, this divider output 4c being connected to the second comparator input 1b.

The reference signal may be supplied by any reference clock module 10, denoted REF_CLOCK. The reference clock module 10 may be contained within a same integrated circuit chip as the PLL device, or may be external to such chip.

The phase comparator 1 and the loop filter 2 may be of any type known, analog or digital. In particular, for analog implementations, the phase comparator 1 may be comprised of a phase-frequency detector combined downstream with a charge pump. Digital implementations of the loop filter 2 may include a digital-to-analog converter so that the control voltage, which is fed into the control input 3a of the VCO module 3, is always an analog direct signal, similar to the analog implementations of the loop filter 2.

The VCO module 3 may also be of any type known, including without limitation, VCO modules that are provided with frequency range selection. Such a VCO module commonly comprises a capacitor bank (not shown) which produces a capacitance value selected by a digital word fed into an additional input 3b of the VCO module 3. Selecting the capacitance value in this way makes the $F_{VCO}$-frequency vary limitedly within a reduced frequency range when the control voltage, which is denoted $V_{tune}$, is varied at the control input 3a. Thus, the frequency range is selected by the digital word fed into the additional input 3b, and the value of the $F_{VCO}$-frequency is controlled within this frequency range by tuning the $V_{tune}$-voltage. Such selection of the $F_{VCO}$-frequency range is commonly called VCO calibration, and may be performed using a dedicated unit 30 for selecting the digital word.

The frequency-converted signal is denoted as F-converted signal. It is produced by the frequency divider 4 from the VCO signal received at the divider input 4a so that the F-converted signal has a synthesized frequency $F_{DIV}$, which equals the $F_{VCO}$-frequency divided by a division ratio value N. Actually, due to the N-value possibly being a non-integer, the frequency divider 4 is fed appropriately with an instant value as the division ratio N, so that a time-average of the synthesized frequency $F_{DIV}$ matches a result of the $F_{VCO}$-frequency divided by N. In a known manner, the instant value used as the division ratio may be produced by combining an integer part of N with a modulated sequence corresponding to a fractional part of N. The modulated sequence may be produced by an interpolator 41, for example, a sigma-delta modulator, and combined with the integer part using a combiner 40. The output of the combiner 40 may be connected to an additional divider input 4b that is dedicated to receive the instant value of the division ratio.

The phase comparator 1, the loop filter 2, the VCO module 3 and the frequency divider 4 form the PLL loop. According to well-known PLL operation, the voltage $V_{tune}$ results from the time-filtering of the error signal, the F-converted signal results from the N-division of the frequency $F_{VCO}$ of the VCO signal, and the F-converted signal is matched in phase with the reference signal. Also in a known manner, such operation of the PLL device may be monitored by a lock detector (not shown), which tests continually a lock condition for indicating whether the frequency $F_{DIV}$ of the F-converted signal remains very close to the reference frequency $F_{REF}$. Such operation is commonly called lock acquisition step, leading to the lock condition being met. Once the lock condition is met, the VCO signal is frequency-elevated with respect to the reference signal according to the equation: $F_{VCO} \approx F_{REF} \times N$. This is the locked operation of the PLL device, and reducing the duration of the lock acquisition step is an important issue for many applications of the PLL devices.

After the VCO calibration has been performed correctly, both frequencies $F_{DIV}$ and $F_{REF}$ are close to one another thanks to the appropriate selection of the $F_{VCO}$-frequency range that has reduced range length. But the phase time-shift that exists between the F-converted signal and the reference signal is uncontrolled at that time. Actually, the modulated sequence that is fed into the additional divider input 4b is generated taking into account a target value for the time-shift to exist between the respective phases of the F-converted signal and the reference signal. This target value is called phase parameter and denoted PHASE in the figures. Then, the lock acquisition step results in increasing or decreasing slightly the frequency $F_{DIV}$ of the F-converted signal so that the time-shift that actually exists between the phases of the F-converted signal and the reference signal converges in time towards the phase parameter value.

But, for reducing the noise that may impact the PLL loop operation, a gain value of the open PLL loop that is effective during the lock acquisition step is selected to be low, sometimes even very low. The gain value is the ratio between a variation in the $F_{DIV}$-frequency of the F-converted signal and the variation of the $V_{tune}$-voltage that produces the $F_{DIV}$-variation. It results from the low gain value that much time during the lock acquisition step may be needed for the time-shift that actually exists between the phases of the F-converted signal and the reference signal to match the phase parameter value.

The present invention solves the disadvantages of the prior art by disclosing a device that reduces the duration until the lock condition is met, so-called lock time, for a PLL device which starts operating or recovers the lock state after it has been lost. This first object of lock time reduction applies in particular for a PLL device which is operated with a low value for the open PLL loop gain.

Furthermore, the present invention also operates simultaneously several PLL devices using a single reference signal, while ensuring that desired time-shifts actually exist between the respective F-converted signals of the PLL devices.

BRIEF SUMMARY

To achieve these and other objects of the invention, in some embodiments, phase-locked loop device comprises a phase comparator comprising a first comparator input configured to receive a reference signal comprised of a reference cycle repeated at a reference frequency ($F_{REF}$), a second comparator input configured to receive a frequency-converted signal, and a comparator output configured to produce an error signal representative of a phase time-shift existing between the reference signal and the frequency-converted signal; a loop filter comprising a filter input connected to the comparator output, and suitable for producing a control voltage ($V_{tune}$) based on a time-filtering of the error signal at a filter output; a voltage-controlled oscillator (VCO) module, comprising a control input connected to the filter output, and a VCO output configured to produce a VCO signal having a VCO frequency ($F_{VCO}$) varying as a function of the control voltage; and a frequency divider, connected at a divider input to the VCO output, and configured to produce at a divider output the frequency-converted signal based on the VCO signal, the divider output being connected to the second comparator input; and synchronization units arranged to control a stop in an operation of the frequency divider so that the stop is triggered by a signal transition occurring in one cycle of the frequency-converted signal, and to allow the operation of the frequency divider to start again so that the frequency-converted signal is triggered at operation restart by a signal transition occurring in one later repetition of the reference cycle after the stop of the frequency divider operation.

Hence, the synchronization of the frequency-converted signal relative to the reference signal is obtained by temporarily suspending the division of the VCO frequency. It is then compatible with ensuring a target value for the phase time-shift between both signals, also within the frequency divider.

Because such synchronization ensures that the time-shift that actually exists between the phases of the frequency-converted signal and the reference signal matches the target value at the restart of the frequency divider operation, there is no further need to increase or decrease the frequency of the VCO signal only for matching the phase parameter. When such synchronization is performed during the lock acquisition step, preferably at the beginning of this step, the lock time of the PLL device is reduced. This is especially advantageous when the PLL device is running with a low value for the open PLL loop gain. The time lock can be reduced by a significant extent while maintaining low noise level within the PLL loop thanks to the low gain value itself.

In some embodiments of the invention, the synchronization units are configured to start again the operation of the frequency divider so that at least two repetitions of the reference cycle elapse between the stop of the frequency divider operation and the later repetition of the reference cycle that triggers the frequency-converted signal at the operation restart.

This ensures that no cycle slip occurs in the PLL operation after the restart of the frequency divider, because the frequency-converted signal is then synchronized with the reference signal. In some embodiments, the synchronization capabilities may be designed so that only two reference cycle repetitions elapse between the stop of the frequency divider operation and the later reference cycle repetition which triggers the frequency-converted signal at the operation restart of the frequency divider. Synchronization is faster in this way.

In some embodiments, the synchronization units may be arranged to switch off a transmission of the VCO signal from the VCO output to the divider input.

In some embodiments, the frequency divider is configured to perform a counting of cycles which occur successively within the VCO signal, and the synchronization units are arranged to hold the counting between the stop and the restart of the frequency divider operation.

In further embodiments, the frequency divider is configured to produce a down-count based on successive cycles occurring within the VCO signal, and the synchronization units are arranged to reset the down-count between the stop and the restart of the frequency divider operation.

In other embodiments of the invention PLL device, the synchronization units further comprise a first D-flipflop with a synchronization input connected to receive the frequency-converted signal, a data input connected to an upper-level voltage terminal, and an output; a second D-flipflop with a synchronization input connected to receive the reference signal, a data input connected to the output of the first D-flipflop, and an output; and a combination unit with first input connected to the output of the first D-flipflop, and second input connected for receiving a binary value derived at least partly from the output of the second D-flipflop, and the combination unit configured to produce a combination signal containing a stop-controlling transition and then a restart-controlling transition, the stop-controlling transition corresponding to a binary value transition occurring at the output of the first D-flipflop, and the restart-controlling transition corresponding to a transition in the binary value derived at least partly from the output of the second D-flipflop, wherein the synchronization units are arranged at an output so that the combination signal controls the stop and the restart of the operation of the frequency divider.

In some embodiments, the synchronization units further comprise a chain comprising at least one additional D-flipflop each with a respective synchronization input connected for receiving the reference signal, a respective data input connected to an output of the preceding additional D-flipflop within the chain, the data input of one first additional D-flipflop within the chain being connected to the output of the second D-flipflop, and the second input of the combination unit being connected to the output of one last additional D-flipflop within the chain, so that the binary value received by the second input of the combination means is derived at least partly from the output of the last additional D-flipflop, wherein the restart-controlling transition of the combination signal corresponds to a binary value transition occurring at the output of the last D-flipflop within the chain.

Such chain leads to restart the operation of the frequency divider upon occurrence of the rising edge of the $(X+1)^{th}$ cycle repetition in the reference signal after the frequency divider operation has been stopped, where X is the number of D-flipflops in the chain, greater than unity.

In some embodiments of the invention, a method for operating a phase-locked loop device comprise a VCO calibration step, wherein a frequency range is selected for the VCO module, so that the selected frequency range contains a product of the reference frequency by a frequency division ratio that is implemented within the frequency divider; a synchronization step, wherein a stop and a restart of the operation of the frequency divider are controlled by the synchronization units; and a lock acquisition step, wherein the phase-locked loop device is operating by tuning a direct voltage fed into the control input of the VCO module, until a lock condition is continually met.

Another embodiment of the present invention relates to a method for operating simultaneously several phase-locked loop devices, comprising supplying one and same common reference signal produced by one reference clock module shared by the phase-locked loop devices to all the phase-locked loop devices at the respective first comparator inputs with; implementing one and same common frequency division ratio to the respective frequency dividers of the phase-locked loop devices; and providing to each one of the phase-locked loop devices with a respective interpolator arranged to feed the frequency divider of the phase-locked loop device with a time-modulated sequence corresponding to a fractional part of the common frequency division ratio, so that a time-average of instant division ratio values implemented successively within the frequency divider according to the modulated sequence equals the common frequency division ratio, wherein the interpolator of each one of the phase-locked loop devices is provided with a value of a phase parameter as a target time-shift to exist between a phase of the frequency-converted signal produced by the frequency divider and a phase of the reference signal, and the frequency dividers of the phase-locked loop devices are fed by the interpolators with the respective modulated sequences corresponding all to the common frequency division ratio but corresponding separately to the values provided respectively to the interpolators for the phase parameter, and wherein the method further comprises the following step performed once all the phase-locked loop devices are currently operating by tuning respective direct voltages that are fed into the control inputs of the respective VCO modules, while a lock condition is met for each one of the phase-locked loop devices: activating simultaneously the respective synchronization units of all the phase-locked loop devices so that the operations of the frequency dividers are stopped and started again at a same later time according to the common reference signal. In addition, the interpolator of each one of the PLL devices is provided with a value of a phase parameter as a target time-shift to exist between a phase of the frequency-converted signal which is produced by this frequency divider and a phase of the reference signal. Hence, the frequency dividers of the PLL devices are fed by the interpolators with the respective modulated sequences corresponding all to the common frequency division ratio but corresponding separately to the values which are provided respectively to the interpolators for the phase parameter. Then, the multi-PLL process comprises the following step which is performed once all the PLL devices are currently operating by tuning respective direct voltages which are fed into the control inputs of the respective VCO modules, while a lock condition is met for each one of the PLL devices: activating simultaneously the respective synchronization capabilities of all the PLL devices so that the operations of the frequency dividers are stopped and started again at a same later time according to the common reference signal.

By this way, the phase parameter value which is provided to each one of the interpolators applies without any phase shift due to initial mismatch appeared before the lock condition is met for the PLL device concerned.

Thus, according to the third invention aspect, the synchronization is performed simultaneously for all PLL devices once they are all running in locked operation. Obviously, this locked operation may have existed for variable duration before the overall synchronization is performed, depending on the PLL device. The multi-PLL process of this third invention aspect allows obtaining desired time-shifts between the phases of the respective frequency-converted signals of the PLL devices, despite the PLL devices may have had different phase trajectories before synchronization.

Preferably, the respective synchronization units of all the phase-locked loop devices are activated using a common synchronization request transmitted simultaneously to the synchronization units.

In some embodiments, each one of the phase-locked loop devices is first operated by performing the VCO, synchronization, and lock acquisition steps independently from the other ones of the phase-locked loop devices, until the lock condition is met for each one of the phase-locked loop devices, and thereafter the step of activating simultaneously the respective synchronization units of all the phase-locked loop devices is performed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention. In the drawings:

FIGS. 4a to 4h are time-diagrams explaining the operation of the synchronization means of FIG. 3.

Same reference numbers which are indicated in different ones of these figures denote identical elements of elements with identical function. In addition, components with well-known functions and operation but not connected directly to the invention features are not described in detail.

DETAILED DESCRIPTION OF THE INVENTION

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present invention and the subject matter may be practiced without these specific details.

Figure 1:
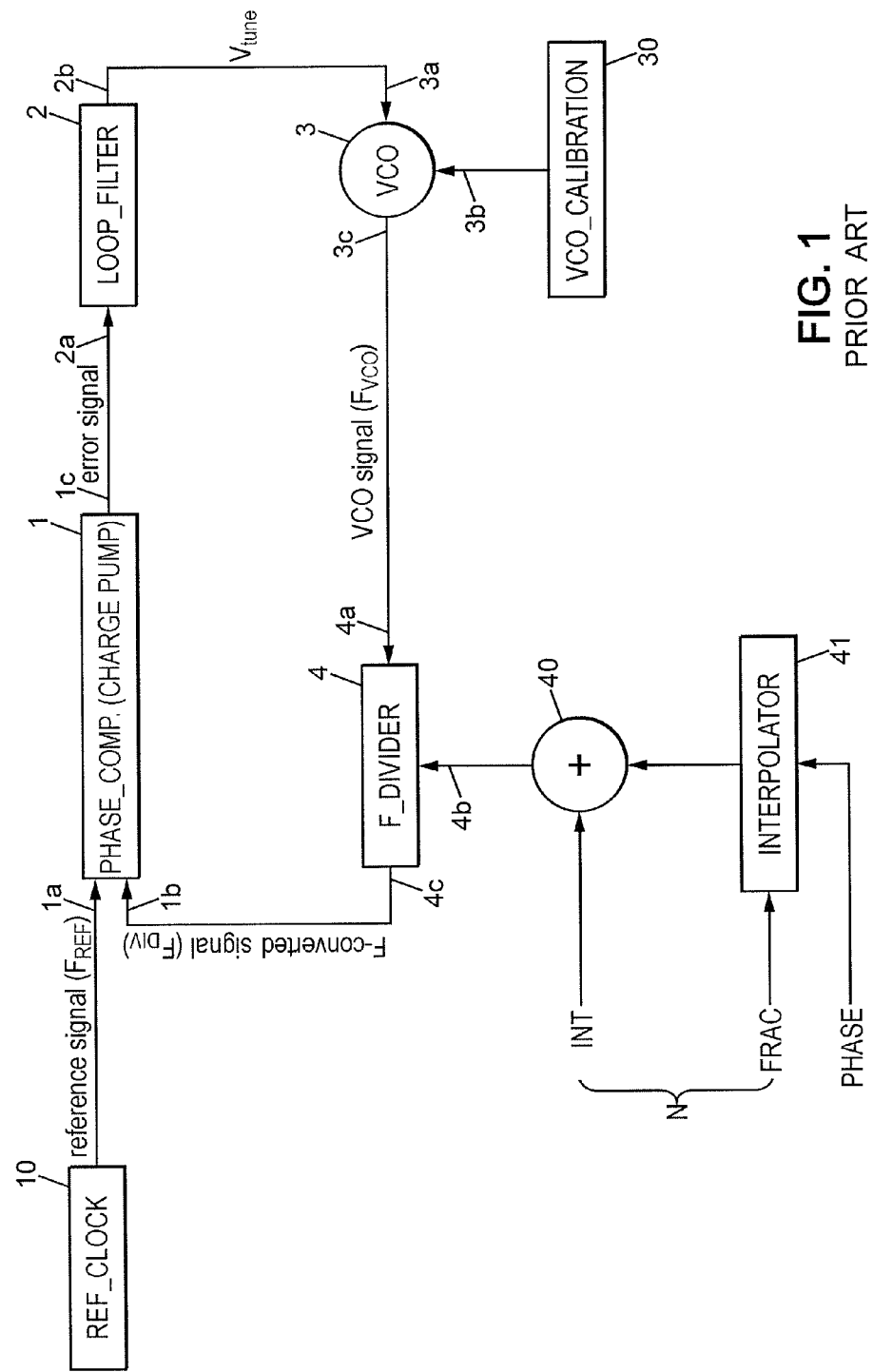
FIG. 1 is a block diagram of a conventional PLL device.
Figure 2:
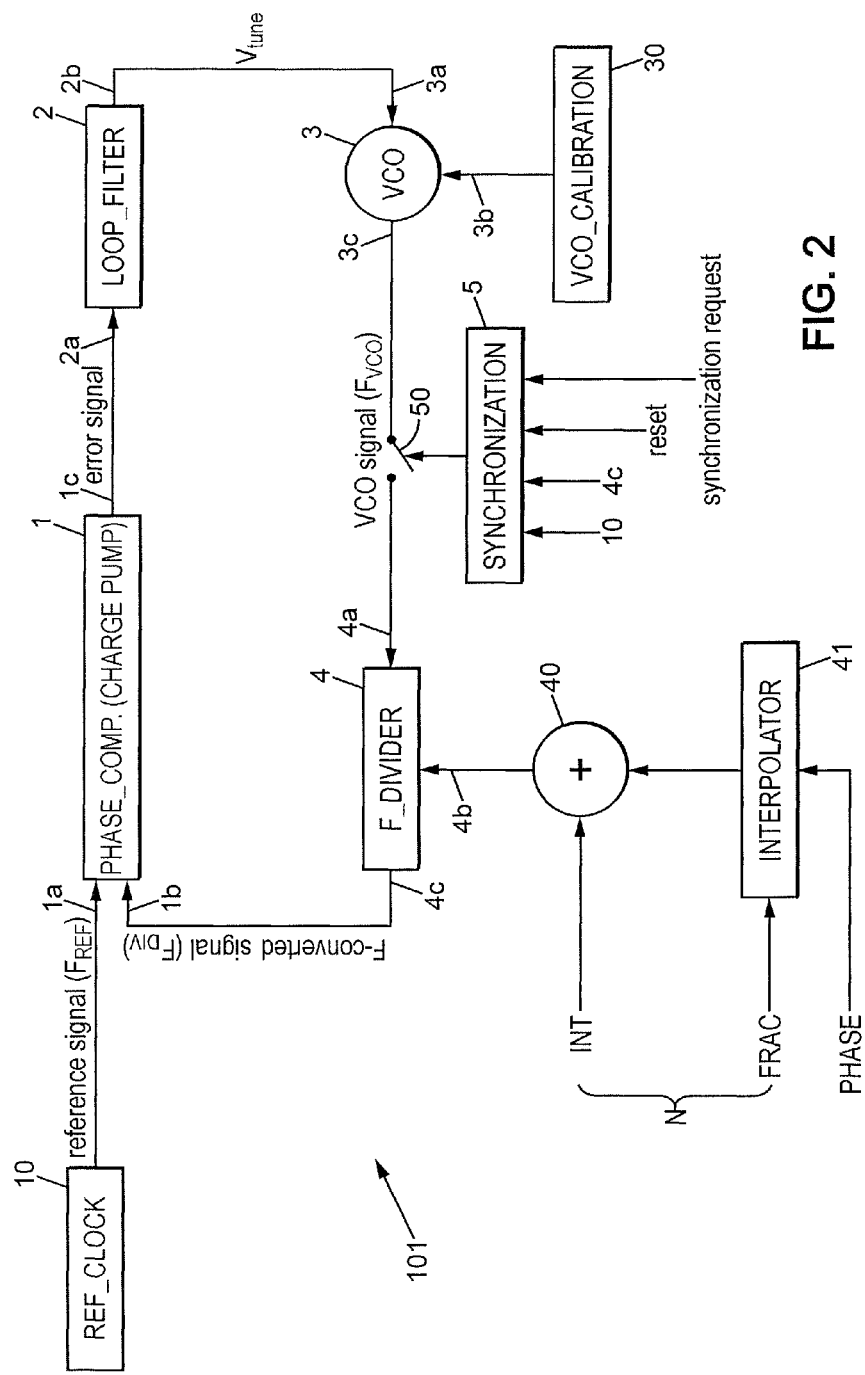
FIG. 2 is a block diagram of a PLL device in accordance with an embodiment of the present invention.

Referring to FIG. 2, a PLL device 101 may have a structure and operation similar to that described in connection with FIG. 1. However, the PLL device is completed with the synchronization means 5. The synchronization means 5 may have several inputs, including ports for receiving, respectively, the reference signal from the reference clock module 10, the F-converted signal from the divider output 4c, and a synchronization request. An additional port may also be provided to the synchronization means 5 for allowing a reset of these synchronization means.

Also depending on the actual structure of the frequency divider 4 which is used within the PLL device 101, the synchronization means 5 may control the frequency divider in different ways. FIG. 2 illustrates an embodiment where the synchronization means 5 control the feeding of the divider input 4a with the VCO signal. In such embodiment, the connection from the VCO output 3c to the divider input 4a comprises a switch 50 that is controlled by the synchronization means 5. Thus, the switch 50 being turned off by a suitable command signal produced by the synchronization means 5 stops the production of the F-converted signal by the frequency divider 4, and the switch 50 being turned back to on-state allows restart of the operation of the frequency divider 4. According to the invention, the synchronization units 5 are designed to drive the switch 50 into the off-state at a time that is determined based on the F-converted signal, and then to drive the switch 50 back into the on-state at a later time that is determined based on the reference signal. Value transitions are detected by the synchronization units 5 within the F-converted signal and the reference signal for triggering these switching events.

For suitable designs of the frequency divider 4, the command signal that is produced by the synchronization units 5 may be transmitted to a control input that is provided at the frequency divider 4 itself. When the frequency divider 4 operates by counting the successively elapsing cycles of the VCO signal, the up- or down-counting, which is implemented within the frequency divider 4, may be stopped and started again by the command signal produced by the synchronization units 5. Such stop and restart of the counting may implement either putting the count on hold temporarily or producing a count reset.

Figure 3:
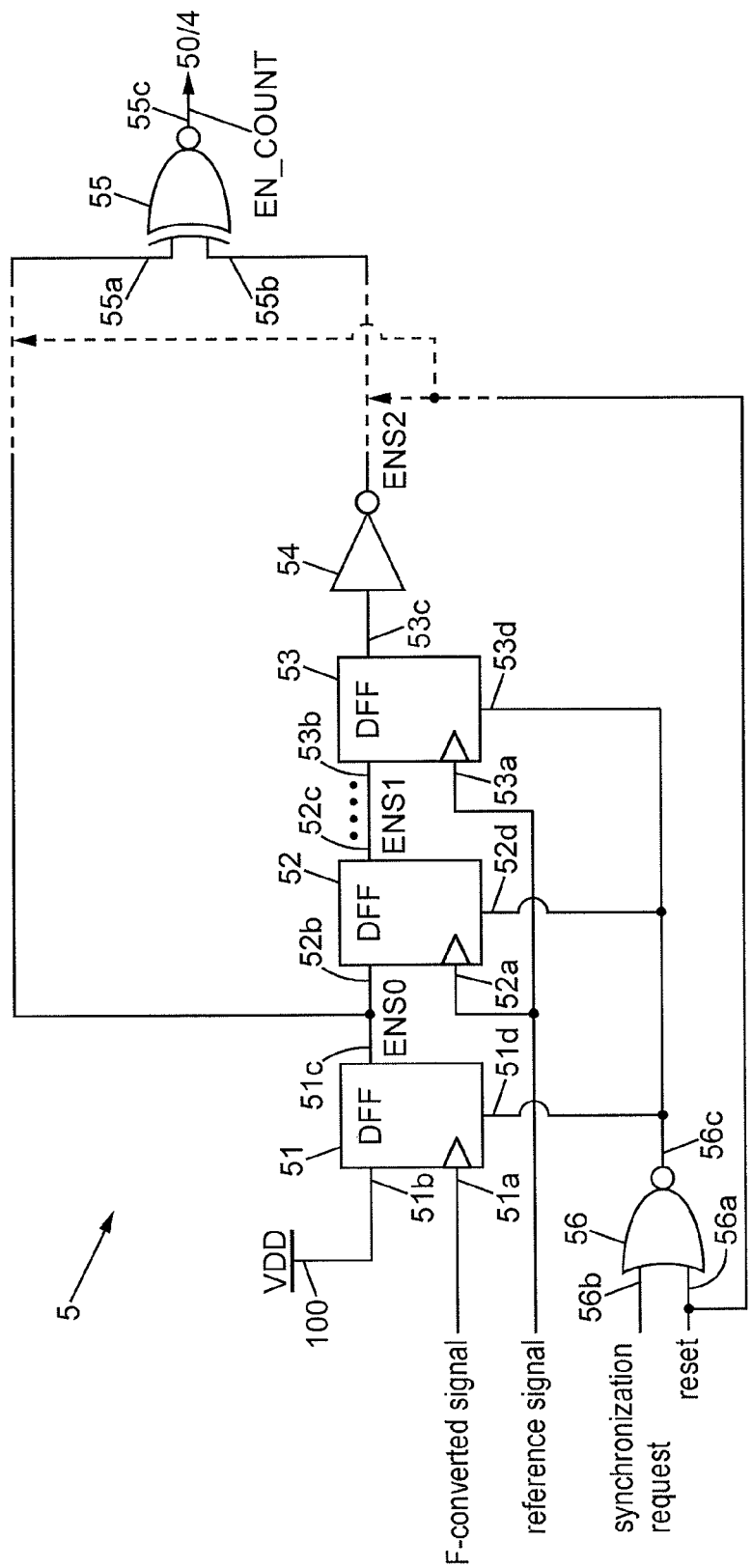
FIG. 3 is a circuit diagram of a possible embodiment for synchronization means implemented according to the invention.

FIG. 3 illustrates a possible embodiment for the synchronization units 5. Reference numbers used in this figure have the following meanings:

51, 52 and 53 D-flipflops denoted DFF, with synchronization input 51a (respectively 52a and 53a), data input 51b (resp. 52b and 53b) and output 51c (resp. 52c and 53c)
54 binary inverter
55 XOR operator, with inputs 55a and 55b, and output 55c
56 NOR operator, with inputs 56a and 56b, and output 56c
100 reference voltage terminal with voltage value VDD equivalent to upper level in binary signals ENS0, ENS1 and ENS2 are the intermediate binary signals issued respectively by the D-flipflop 51, the D-flipflop 52 and the inverter 54. EN_COUNT is the signal that is issued by the synchronization units 5 and transmitted to the frequency divider 4 or the switch 50. The diagrams 4a to 4h respectively show the time-variations of the reset signal, the reference signal, the F-converted signal, the synchronization request, the signals ENS0, ENS1, ENS2 and EN_COUNT. t denotes time in X-axis and the time-diagrams 4a to 4h all correspond to each other along vertical alignment. Y-axes are in arbitrary units, simply indicating the signal transitions between the lower and the upper binary values.

The NOR operator 56 combines a reset command already applied at input 56a with a synchronization request newly applied at input 56b, for producing an enabling signal at output 56c. This enabling signal is applied to respective enabling inputs 51d, 52d and 53d of the D-flipflops 51, 52 and 53, and sets initially the signals ENS0, ENS1 and EN_COUNT to the lower binary value, and the signal ENS2 to the upper binary value. The reset command may also be combined with the useful signals received at the inputs 55a and 55b for resetting the XOR operator 55 too. Because such combination is known in the art with many variants, the connections of the input 56a to the inputs 55a and 55b are represented in broken lines.

The input 51a is connected for receiving the F-converted signal and the input 51b is connected to the reference voltage terminal 100. So, the intermediate signal ENS0 turns from the initial lower binary value to the upper binary value at the first rising edge of the F-converted signal which occurs after the enabling signal outputted by the NOR operator 56 has become ON (see FIGS. 4a, 4c, 4d and 4e).

The input 52a is connected for receiving the reference signal and the input 52b is connected to the output 51c for receiving the intermediate signal ENS0. So, the intermediate signal ENS1 turns from the initial lower binary value to the upper binary value at the first rising edge of the reference signal that occurs after the intermediate signal ENS0 has itself turned to the upper binary value (see FIGS. 4b, 4e and 4f).

The input 53a is also connected for receiving the reference signal and the input 53b is connected to the output 52c for receiving the signal intermediate ENS1. So, the intermediate signal ENS2 issued by the inverter 54 turns from the initial upper binary value to the lower binary value at the first rising edge of the reference signal that occurs after the intermediate signal ENS1 has itself turned to the upper binary value (see FIGS. 4b, 4f and 4g).

The XOR operator 55 receives at its own inputs 55a and 55b the intermediate signals ENS0 and ENS2, and combines them so that the signal EN_COUNT equals to the upper binary value only between the first rising edge of the F-converted signal that has occurred after the synchronization request, and the second rising edge of the reference signal that has occurred after this first rising edge of the F-converted signal. For this reason, the signal EN_COUNT has been called combination signal in the general part of this description. It is dedicated to enabling the frequency divider 4 to run when the EN_COUNT signal equals to the lower binary value, and holding on the frequency divider 4 when the EN_COUNT equals the upper binary value. According to the operation of the synchronization units 5 just described, the frequency divider 4 restarts at a rising edge of the reference signal, from the frequency divider state that was existing at the time of a previous rising edge of the F-converted signal. In this manner, the F-converted signal, which is produced from the frequency divider restart, is synchronized relative to the reference signal.

It is possible to increase the number of reference signal cycles that elapse between the stop and restart of the frequency divider 4 by adding other D-flipflops (not shown) connected serially between the D-flipflop 53 and the inverter 54. The data input of any such additional D-flipflop is connected to the output of the previous one in the serially connected D-flipflop chain, starting from the output 53c of the D-flipflop 53. The enabling inputs of all additional D-flipflops may be connected to the output 56c and their synchronization inputs are all connected for receiving the reference signal. The output of the last additional D-flipflop in the chain is connected to the input of the inverter 54. Adding one further D-flipflop in the chain results in delaying the operation restart of the frequency divider 4 by one more cycle of the reference signal.

Figure 5A:
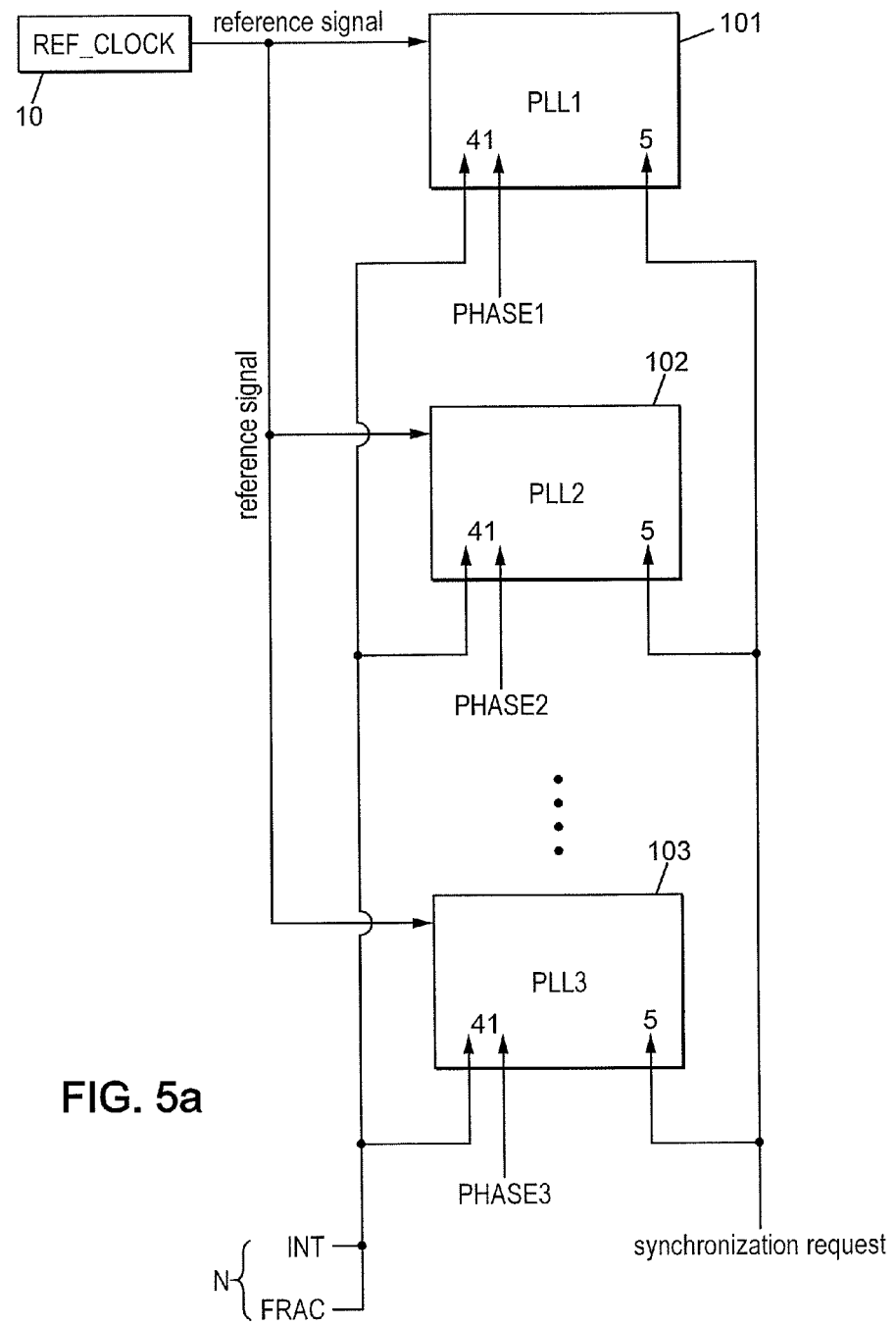
FIGS. 5a and 5b illustrate a multi-PLL process in accordance with an embodiment of the present.
Figure 5B:
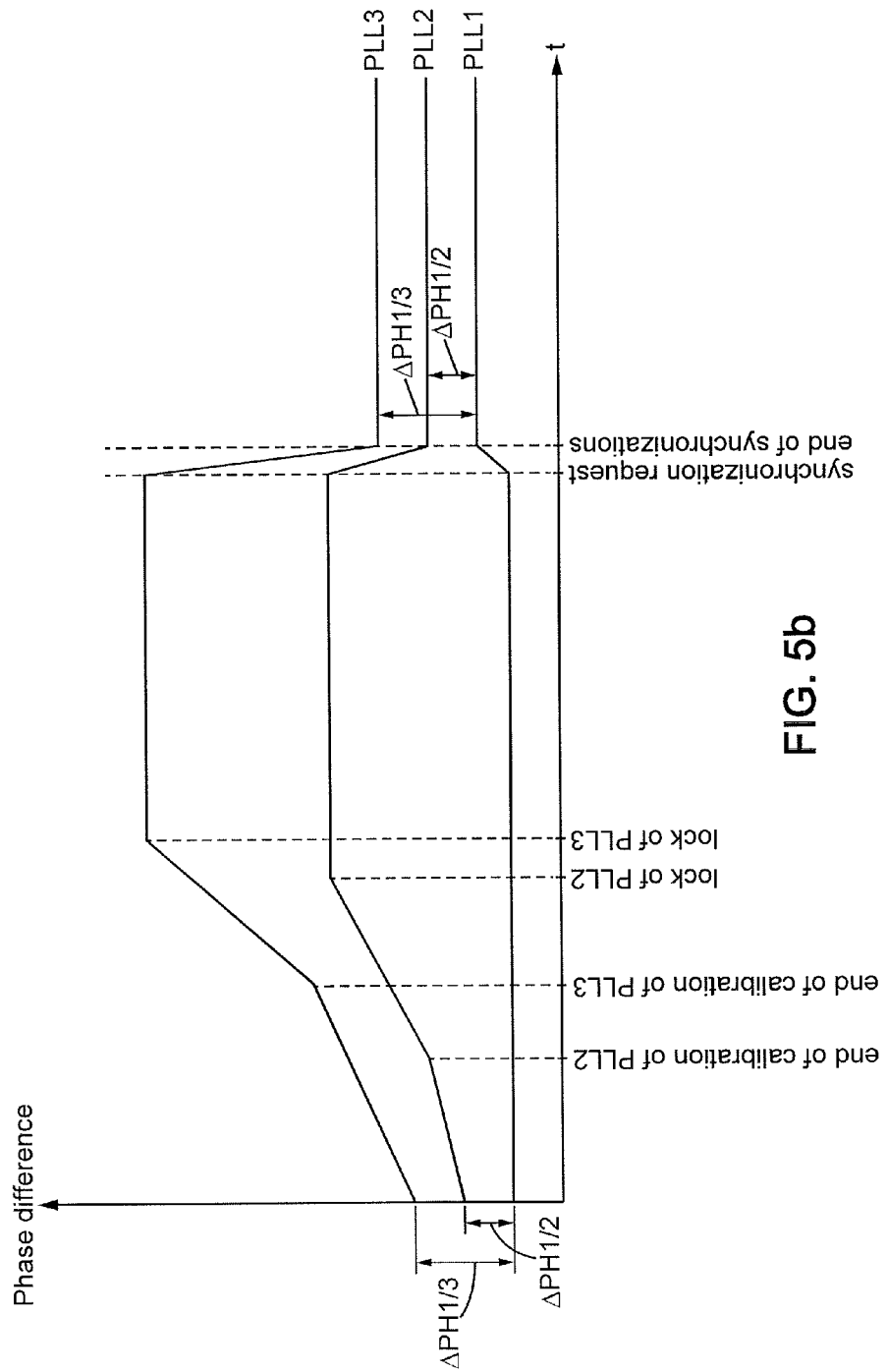

FIGS. 5*a* and 5*b* illustrate a particular application of the invention to multiple PLL devices, when the F-converted signals of these PLL devices are to be synchronized with respect to each other. This is obtained by supplying all these PLL devices with a common reference signal originating from the same reference clock module 10. In FIG. 5*a*, three PLL devices are considered as a non-limiting example. They are denoted PPL1, PLL2 and PLL3, and labelled 101, 102 and 103. The PLL devices are all in accordance with the invention, so that they are all provided with respective synchronization units 5. They each comprise respective interpolators 41, which feed separately from each other the frequency dividers 4 with modulated sequences corresponding to a division ratio fractional part. Preferably but not necessarily, the PLL devices 101 to 103 may be identical to each other. They are connected to implement the same division ratio N and the same synchronization requests. More precisely, the PLL devices are designed so that their respective frequency dividers are fed with modulated sequences matching the same N-value, but differing only by the value of the phase parameter that is assigned to each one of the PLL devices using the corresponding interpolator 41. Thus, the phase parameter value assigned to PLL1 is denoted PHASE1, that assigned to PLL2 is denoted PHASE2, and that for PLL3 is denoted PHASE3. The respective frequency dividers of the PLL devices 101 to 103 may be fed with modulated sequences corresponding to the N-division ratio value, when N is non-integer, which are all identical but each delayed according to the phase parameter value that is assigned to the PLL device considered.

FIG. 5*b* is a time-diagram illustrating phase trajectories of the respective F-converted signals of the PLL devices 101, 102 and 103. Time t is in X-axis again. The phase of the PLL device 101 before synchronization is used as a reference for the phases of all PLL devices. ΔPH1/2 denotes the difference in the phase parameter values PHASE1 and PHASE2 which are assigned to the PLL devices 101 and 102, and ΔPH1/3 the difference between the phase parameter values PHASE1 and PHASE3. Although the respective phases may be set initially in accordance with the phase parameter differences ΔPH1/2 and ΔPH1/3 upon starting the calibration of the PLL devices 101-103, the phases vary in time differently for the three PLL devices 101-103 during their respective calibrations, due to different calibration sequences which are involved separately within the PLL devices. Then, the phases also vary differently during the lock acquisition steps of the PLL devices 101-103, in particular because of time-response features that are different for the three PLL devices. According to the invention, a synchronization process which is requested after the three PLL devices 101-103 are each locked, and simultaneously for the three PLL devices 101-103, leads to recovering differences between the respective actual phases of the F-converted signals that match the phase parameter differences ΔPH1/2 and ΔPH1/3. Then, because the PLL devices 101-103 are all running in locked state and the synchronization request applies simultaneously to the three PLL devices, the phase differences between their respective F-converted signals remain constant over time after the end of the general synchronization.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

The invention claimed is:

1. A phase-locked loop device comprising:
   a phase comparator comprising a first comparator input configured to receive a reference signal comprised of a reference cycle repeated at a reference frequency ($F_{REF}$), a second comparator input configured to receive a frequency-converted signal, and a comparator output configured to produce an error signal representative of a phase time-shift existing between the reference signal and the frequency-converted signal;
   a loop filter comprising a filter input connected to the comparator output, and suitable for producing a control voltage ($V_{tune}$) based on a time-filtering of the error signal at a filter output;
   a voltage-controlled oscillator (VCO) module, comprising a control input connected to the filter output, and a VCO output configured to produce a VCO signal having a VCO frequency ($F_{VCO}$) varying as a function of the control voltage;
   a frequency divider, connected at a divider input to the VCO output, and configured to produce at a divider output the frequency-converted signal based on the VCO signal, the divider output being connected to the second comparator input; and
   synchronization units arranged to control a stop in an operation of the frequency divider so that the stop is triggered by a signal transition occurring in one cycle of the frequency-converted signal, and to allow the operation of the frequency divider to start again so that the frequency-converted signal is triggered at operation restart by a signal transition occurring in one later repetition of the reference cycle after the stop of the frequency divider operation, wherein
      the synchronization units are arranged to switch off a transmission of the VCO signal from the VCO output to the divider input.

2. The phase-locked loop device according to claim 1, wherein the synchronization units are configured to start again the operation of the frequency divider so that at least two repetitions of the reference cycle elapse between the stop of the frequency divider operation and the later repetition of the reference cycle that triggers the frequency-converted signal at the operation restart.

3. The phase-locked loop device according to claim 1, wherein the frequency divider is configured to perform a counting of cycles which occur successively within the VCO signal, and the synchronization units are arranged to hold the counting between the stop and the restart of the frequency divider operation.

4. The phase-locked loop device according to claim 1, wherein the frequency divider is configured to produce a down-count based on successive cycles occurring within the VCO signal, and the synchronization units are arranged to reset the down-count between the stop and the restart of the frequency divider operation.

5. A phase-locked loop device comprising:
   a phase comparator comprising a first comparator input configured to receive a reference signal comprised of a reference cycle repeated at a reference frequency ($F_{REF}$), a second comparator input configured to receive a frequency-converted signal, and a comparator output configured to produce an error signal representative of a phase time-shift existing between the reference signal and the frequency-converted signal;

a loop filter comprising a filter input connected to the comparator output, and suitable for producing a control voltage ($V_{tune}$) based on a time-filtering of the error signal at a filter output;

a voltage-controlled oscillator (VCO) module, comprising a control input connected to the filter output, and a VCO output configured to produce a VCO signal having a VCO frequency ($F_{VCO}$) varying as a function of the control voltage;

a frequency divider, connected at a divider input to the VCO output, and configured to produce at a divider output the frequency-converted signal based on the VCO signal, the divider output being connected to the second comparator input; and synchronization units arranged to control a stop in an operation of the frequency divider so that the stop is triggered by a signal transition occurring in one cycle of the frequency-converted signal, and to allow the operation of the frequency divider to start again so that the frequency-converted signal is triggered at operation restart by a signal transition occurring in one later repetition of the reference cycle after the stop of the frequency divider operation, wherein the synchronization units further comprise:

a first D-flipflop with a synchronization input connected to receive the frequency-converted signal, a data input connected to an upper-level voltage terminal, and an output;

a second D-flipflop with a synchronization input connected to receive the reference signal, a data input connected to the output of the first D-flipflop, and an output; and a combination unit with first input connected to the output of the first D-flipflop, and second input connected for receiving a binary value derived at least partly from the output of the second D-flipflop, and the combination unit configured to produce a combination signal containing a stop-controlling transition and then a restart-controlling transition, the stop-controlling transition corresponding to a binary value transition occurring at the output of the first D-flipflop, and the restart-controlling transition corresponding to a transition in the binary value derived at least partly from the output of the second D-flipflop, wherein the synchronization units are arranged at an output so that the combination signal controls the stop and the restart of the operation of the frequency divider.

6. The phase-locked loop device according to claim 5, wherein the synchronization units further comprise:

a chain comprising at least one additional D-flipflop each with a respective synchronization input connected for receiving the reference signal, a respective data input connected to an output of the preceding additional D-flipflop within the chain, the data input of one first additional D-flipflop within the chain being connected to the output of the second D-flipflop, and the second input of the combination unit being connected to the output of one last additional D-flipflop within the chain, so that the binary value received by the second input of the combination units is derived at least partly from the output of the last additional D-flipflop, wherein the restart-controlling transition of the combination signal corresponds to a binary value transition occurring at the output of the last D-flipflop within the chain.

7. A method for operating simultaneously several phase-locked loop devices, comprising:

supplying one and same common reference signal produced by one reference clock module shared by the phase-locked loop devices to all the phase-locked loop devices at the respective first comparator inputs with;

implementing the one and same common frequency division ratio to the respective frequency dividers of the phase-locked loop devices; and providing to each one of the phase-locked loop devices with a respective interpolator arranged to feed the frequency divider of the phase-locked loop device with a time-modulated sequence corresponding to a fractional part of the common frequency division ratio, so that a time-average of instant division ratio values implemented successively within the frequency divider according to the modulated sequence equals to the common frequency division ratio, wherein the interpolator of each one of the phase-locked loop devices is provided with a value of a phase parameter as a target time-shift to exist between a phase of the frequency-converted signal produced by the frequency divider and a phase of the reference signal, and the frequency dividers of the phase-locked loop devices are fed by the interpolators with the respective modulated sequences corresponding all to the common frequency division ratio but corresponding separately to the values provided respectively to the interpolators for the phase parameter, and wherein the method further comprises the following step performed once all the phase-locked loop devices are currently operating by tuning respective direct voltages that are fed into the control inputs of the respective VCO modules, while a lock condition is met for each one of the phase-locked loop devices:

activating simultaneously the respective synchronization units of all the phase-locked loop devices so that the operations of the frequency dividers are stopped and started again at a same later time according to the common reference signal, wherein the respective synchronization units of all the phase-locked loop devices are activated using a common synchronization request transmitted simultaneously to the synchronization unit.

8. A method for operating simultaneously several phase-locked loop devices, comprising:

supplying one and same common reference signal produced by one reference clock module shared by the phase-locked loop devices to all the phase-locked loop devices at the respective first comparator inputs with;

implementing the one and same common frequency division ratio to the respective frequency dividers of the phase-locked loop devices; and providing to each one of the phase-locked loop devices with a respective interpolator arranged to feed the frequency divider of the phase-locked loop device with a time-modulated sequence corresponding to a fractional part of the common frequency division ratio, so that a time-average of instant division ratio values implemented successively within the frequency divider according to the modulated sequence equals to the common frequency division ratio, wherein the interpolator of each one of the phase-locked loop devices is provided with a value of a phase parameter as a target time-shift to exist between a phase of the frequency-converted signal produced by the frequency divider and a phase of the reference signal, and the frequency dividers of the phase-locked loop devices are fed by the interpolators with the respective modulated sequences corresponding all to the common frequency division ratio but corresponding separately to the values provided respectively to the interpolators for the phase parameter, and wherein the method further comprises the following step performed once all the phase-locked loop devices are currently operating by tuning respective direct voltages that are fed into the control inputs of the respective VCO modules, while a lock condition is met for each one of the phase-locked loop devices;

activating simultaneously the respective synchronization units of all the phase-locked loop devices so that the operations of the frequency dividers are stopped and started again at a same later time according to the common reference signal, wherein each one of the phase-locked loop devices is first operated by performing the VCO, synchronization, and lock acquisition steps independently from the other ones of the phase-locked loop devices, until the lock condition is met for each one of the phase-locked loop devices, and thereafter the step of activating simultaneously the respective synchronization units of all the phase-locked loop devices is performed.

* * * * *